(12) United States Patent
Loud (10) Patent No.: US 8,976,975 B2
(45) Date of Patent: Mar. 10, 2015

(54) BALANCING POWER PLANT SOUND

(75) Inventor: Richard Lynn Loud, Ballston Spa, NY (US)

(73) Assignee: General Electric Company, Schenectady, NY (US)

( * ) Notice: Subject to any disclaimer, the term of this patent is extended or adjusted under 35 U.S.C. 154(b) by 366 days.

(21) Appl. No.: 13/545,669

(22) Filed: Jul. 10, 2012

(65) Prior Publication Data

US 2014/0016790 A1    Jan. 16, 2014

(51) Int. Cl.
*G10K 11/16* (2006.01)
*H03B 29/00* (2006.01)
*H04R 3/02* (2006.01)

(52) U.S. Cl.
USPC .......................................... 381/71.8; 381/73.1

(58) Field of Classification Search
CPC ........................... G10K 2210/121; H03G 3/32
USPC .......................................... 381/73.1, 72, 71.8
See application file for complete search history.

(56) References Cited

U.S. PATENT DOCUMENTS

| | | | | |
|---|---|---|---|---|
| 5,862,230 A | * | 1/1999 | Darby | 381/56 |
| 8,509,450 B2 | * | 8/2013 | Sun | 381/66 |
| 2010/0272285 A1 | | 10/2010 | Loud | |

OTHER PUBLICATIONS

Broner, N., "A Simple Criterion for Low Frequency Noise Emission Assessment", Journal of Low Frequency Noise Vibration and Active Control, vol. 29, No. 1, 2010, pp. 1-13.
Hessler, Jr., George F., "Proposed Criteria for Low Frequency Industrial Noise in Residential Communities", Journal of Low Frequency Noise Vibration and Active Control, vol. 24, No. 2, 2005, pp. 97-106.

* cited by examiner

*Primary Examiner* — Ping Lee
(74) *Attorney, Agent, or Firm* — Hoffman Warnick LLC; Ernest G. Cusick (57) ABSTRACT

Various embodiments of the invention include systems, computer program products, and related methods for managing power plant acoustics. In various embodiments, a system is disclosed including at least one computing device configured to perform the following: determine a difference between an A-weighted sound decibel (dBA) level and a C-weighted sound decibel (dBC) level ($\Delta$ dBC-dBA) from a power plant system within a sound spectrum; compare the $\Delta$ dBC-dBA with a predetermined threshold difference for the sound spectrum; and provide instructions to increase the dBA level of a balancing sound in the spectrum proximate the power plant system in response to determining the $\Delta$ dBC-dBA exceeds the predetermined threshold difference.

20 Claims, 8 Drawing Sheets

BALANCING POWER PLANT SOUND

FIELD OF THE INVENTION

The subject matter disclosed herein relates to power plants. More particularly, aspects of the disclosure relate to the acoustic management of power plants.

BACKGROUND OF THE INVENTION

All power plant systems, which can include components such as gas turbines, steam turbines, electric generators, motors, blowers, compressors, etc. emit noise to the surrounding environment. In a power plant environment, certain environmental noise standards must be met in order to commission the power plant for operation in the environment. Meeting these environmental noise standards can be costly and challenging from an engineering perspective.

BRIEF DESCRIPTION OF THE INVENTION

Various embodiments of the invention include systems, computer program products, and related methods for managing power plant acoustics. In various embodiments, a system is disclosed including at least one computing device configured to perform the following: determine a difference between an A-weighted sound decibel (dBA) level and a C-weighted sound decibel (dBC) level (Δ dBC-dBA) from a power plant system within a sound spectrum; compare the Δ dBC-dBA with a predetermined threshold difference for the sound spectrum; and provide instructions to increase the dBA level of a balancing sound in the sound spectrum proximate the power plant system in response to determining the Δ dBC-dBA exceeds the predetermined threshold difference.

A first aspect of the invention includes a system having at least one computing device configured to perform the following: determine a difference between an A-weighted sound decibel (dBA) level and a C-weighted sound decibel (dBC) level (Δ dBC-dBA) from a power plant system within a sound spectrum; compare the Δ dBC-dBA with a predetermined threshold difference for the sound spectrum; and provide instructions to increase the dBA level of a balancing sound in the sound spectrum proximate the power plant system in response to determining the Δ dBC-dBA exceeds the predetermined threshold difference.

A second aspect of the invention includes a computer-implemented method including: determining a difference between an A-weighted sound decibel (dBA) level and a C-weighted sound decibel (dBC) level (Δ dBC-dBA) from a noise generating source within a sound spectrum; comparing the Δ dBC-dBA with a predetermined threshold difference for the sound spectrum; and providing instructions to increase the dBA level of a balancing sound in the sounds spectrum proximate the noise generating source in response to determining the Δ dBC-dBA exceeds the predetermined threshold difference.

A third aspect of the invention includes a computer program product stored on a computer readable storage medium, which when executed by at least one computing device, causes the at least one computing device to: determine a difference between an A-weighted sound decibel (dBA) level and a C-weighted sound decibel (dBC) level (Δ dBC-dBA) from a noise generating source within a sound spectrum; compare the Δ dBC-dBA with a predetermined threshold difference for the sound spectrum; and provide instructions to increase the dBA level of a balancing sound in the sound spectrum proximate the noise generating source in response to determining the Δ dBC-dBA exceeds the predetermined threshold difference.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As noted herein, the subject matter relates to power plants. More particularly, aspects of the disclosure relate to the acoustic management of power plants.

All power plant systems emit noise to the surrounding environment. In order to install these power plant systems in particular environments, environmental noise standards must be met. In particular, in some environments, permitting for the installation of a power plant system can be based upon levels of sound as well as differences in the levels of different types of sounds. More particularly, in some environments, permitting is based upon an A-weighted sound level (referred to as decibel-A, or dBA level), a C-weighted sound level (referred to as decibel-C, or dBC level) and/or a difference between the dBA level and the dBC level (Δ dBC-dBA).

A sound can exhibit a low frequency imbalance when the difference between the dBC level and the dBA level (Δ dBC-dBA) exceeds a defined threshold (e.g., 15-20 dB). Some power plant systems are regulated such that they must not exceed a dBC level (dBC threshold), a dBA level (dBA threshold), or the difference between the dBC level and the dBA level (Δ dBC-dBA threshold). As is known in the art, A-weighted sounds and C-weighted sounds are different representations of the same sound spectrum. Generally speaking, A-weighted sounds are those sounds which are heard by the human ear, with a decreased contribution of low frequency energy, while C-weighted sounds include nearly all of the low frequency energy which can be felt by the human body. An imbalance between the sound heard and the sound felt can cause annoyance and physical discomfort (e.g., in a human observer).

The conventional approach to meet a Δ dBC-dBA threshold is to reduce the low frequency sound level such that the Δ dBC-dBA is reduced to a level below the threshold level. This is conventionally performed by inserting exhaust "silencers" such as acoustic baffles on the exhaust areas of turbine systems. In this conventional approach, the low frequency sound level is reduced (which reduces the dBC level), while the higher frequency sound level is unchanged (generally leaving the dBA level unchanged), thereby reducing the Δ dBC-dBA value. However, as noted herein, this conventional approach can require designing, manufacturing and installing additional hardware, which can be costly, time-consuming and inefficient.

In contrast to the conventional approaches, various embodiments of the invention include approaches which initiate an increase in high-frequency sound (which increases the dBA level) from a power plant system to reduce the Δ dBC-dBA value for that power plant system. In particular embodiments, methods according to various embodiments include: determining a difference between an A-weighted sound decibel (dBA) level and a C-weighted sound decibel (dBC) level (Δ dBC-dBA) from the noise generating source within a sound spectrum (e.g., across a frequency range); comparing the Δ dBC-dBA with a predetermined threshold difference for the sound spectrum; and increasing the dBA level proximate the noise generating source in response to determining the Δ dBC-dBA exceeds the predetermined threshold difference for the sound spectrum. It is understood that in various embodiments, determining a difference between the dBA level and the dBC level can include determining the dBA level and the dBC level separately, and subsequently comparing that dBA level with that dBC level.

Figure 1:
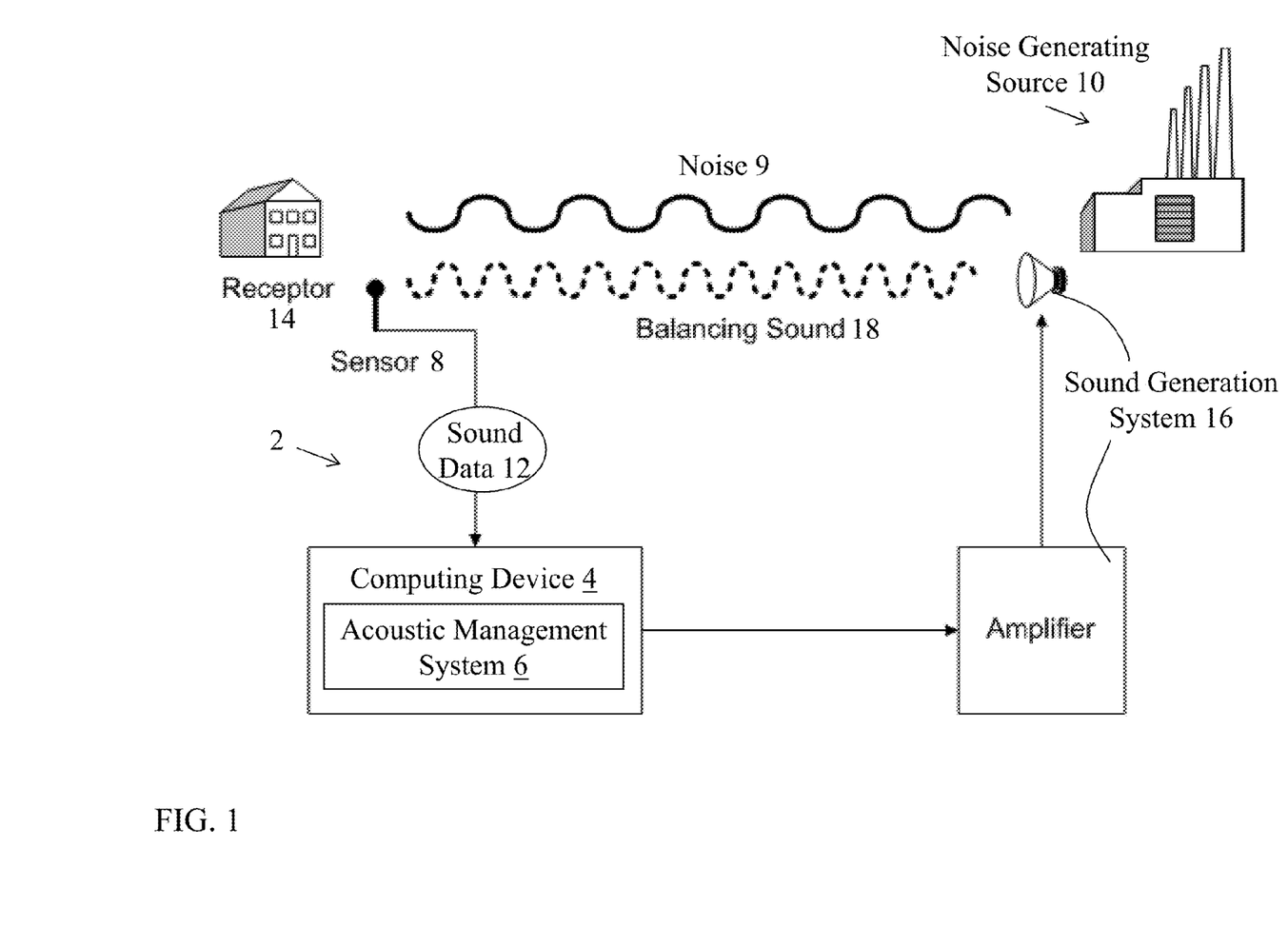
FIG. 1 shows a schematic depiction of a system within an environment according to various embodiments of the invention.

FIG. 1 shows an illustrative environment including schematic depictions of a system 2 according to various embodiments of the invention. As shown, the system 2 can include at least one computing device 4, which in some cases includes an acoustic management system 6. The acoustic management system 6 can include hardware and/or software for performing functions according to various embodiments of the invention. The acoustic management system 6 can be operably connected (e.g., via wireless and/or hard-wired means) with a sensor 8, which can include a conventional microphone or other acoustic detection mechanism. The sensor 8 can be positioned to detect a noise (e.g., sound) 9 emitted from a noise generating source 10. The noise generating source 10 can include a power plant system, e.g., a system for generating power which may include one or more turbines (gas, steam, wind, or hydro), electric generators, boilers, fluid tanks, alternators, batteries, etc.

The acoustic management system 6 can obtain sound data 12 from the sensor 8 about the level and type of noise (or, sound) generated by the noise generating source 10 across a particular sound spectrum (e.g., across a range of frequencies). The acoustic management system 6 can parse the sound data 12 to determine different types of sound (e.g., high frequency and low frequency) in the noise. For example, the acoustic management system 6 can obtain the sound data 12 and determine an A-weighted sound decibel (dBA) level in the sound data 12. The acoustic management system 6 can further determine a C-weighted sound decibel (dBC) level in the sound data 12. It is understood that in various embodiments, the sound data 12 can already include data indicative of the dBA level and/or the dBC level, such that the acoustic management system 6 does not need to determine the dBA level and/or the dBC level.

After determining the dBA level and the dBC level, the acoustic management system 6 can also determine a difference between the dBA level and a dBC level within the sound spectrum, the difference indicated by: Δ dBC-dBA. As noted herein, parameters for operation of a power plant system can include limitations on the Δ dBC-dBA level. In the interest of meeting these parameters, the acoustic management system 6 can compare the Δ dBC-dBA with a predetermined threshold difference within that spectrum. This threshold can be based upon an industry-related parameter dictated by one or more factors such as distance between the noise generating source 10 and a receptor 14 (e.g., a residence, a school, a hospital, etc.), an amount of sound dampening between the noise generating source 10 and the receptor 14, a density of receptors 14 within a proximity of the noise generating source 10, etc.

It is understood that in various alternative embodiments, the sound data 12 can include the Δ dBC-dBA, such that the acoustic management system 6 does not need to compare the dBC with the dBA to determine the difference.

As described herein, in response to the acoustic management system 6 determining that the Δ dBC-dBA exceeds the predetermined threshold difference, the acoustic management system 6 can provide instructions to a sound generation system 16 to increase the dBA level of a balancing sound 18 within the spectrum proximate to the noise generating source 10. The sound generation system 16 can be operably connected with the acoustic management system 6, and can include an amplifier and a speaker for generating the balancing sound 18 and broadcasting that balancing sound 18 to the receptor 14. By increasing the dBA level of the balancing sound 18, the acoustic management system 6 can decrease the Δ dBC-dBA at the receptor 14, and in some cases, can increase the dBA level of the balancing sound 18 incrementally until the Δ dBC-dBA level drops below the predetermined threshold.

It is understood that in some embodiments, the dBA level is also subject to certain predetermined criteria, e.g., a distinct threshold upper level. In these cases, the acoustic management system 6 can instruct the sound generating system 16 to increase the dBA level of the balancing sound 18 only up to the dBA threshold level. That is, the acoustic management system 6 can be configured to limit the increase of the dBA level of the balancing sound 18 based upon a predetermined threshold.

In various embodiments of the invention, the predetermined thresholds (e.g., Δ dBC-dBA threshold(s), dBA threshold(s), etc.) can be stored in a memory of the acoustic management system 6, or in another readily available memory device.

As described herein, various embodiments of the invention include a computer-implemented method (as well as an associated computer program product, and computer system). In some cases, the method can include a plurality of processes, as illustrated in the flow diagram of FIG. 4.

Figure 2:
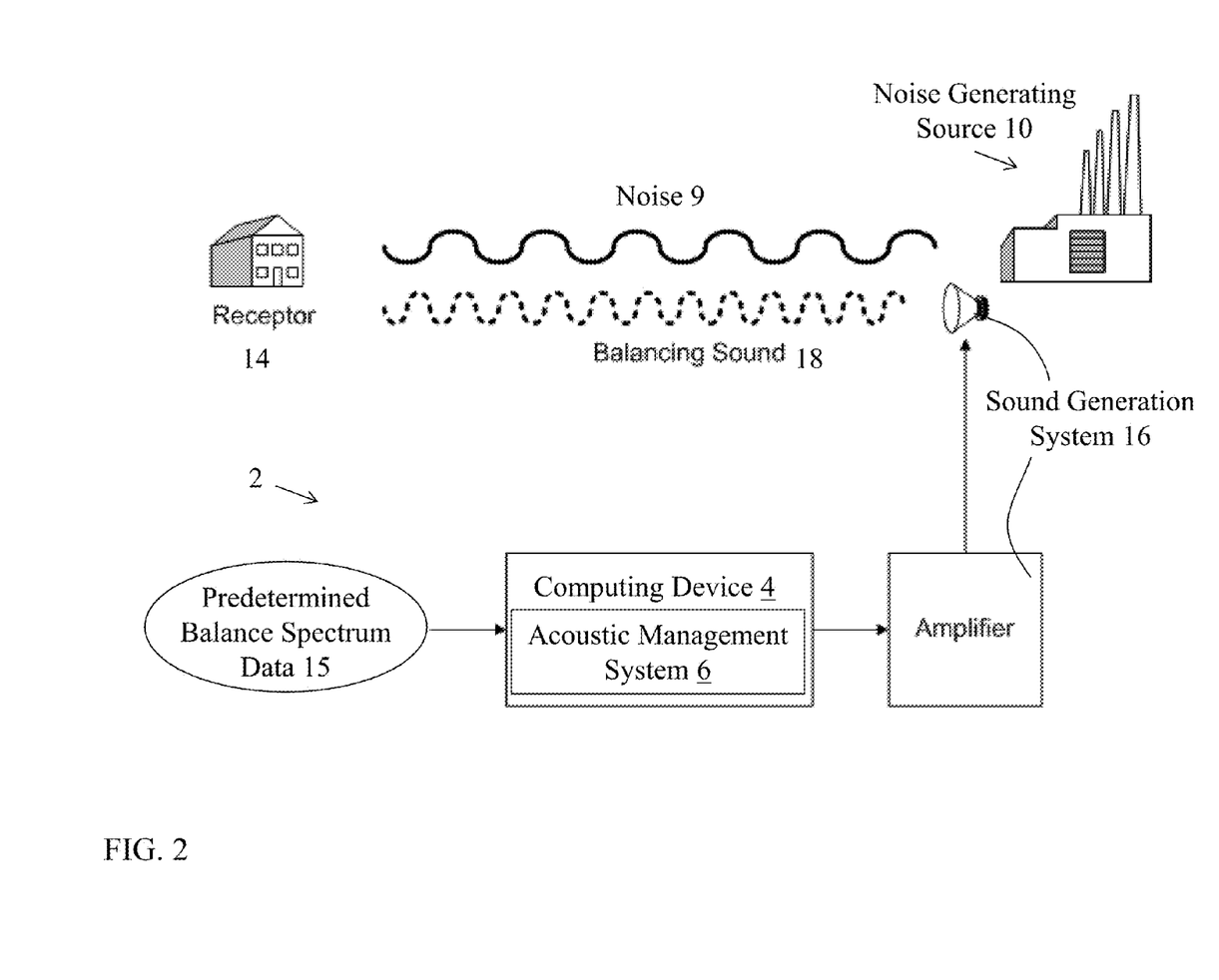
FIG. 2 shows a schematic depiction of a system within an environment according to various embodiments of the invention.

FIG. 2 shows an alternative embodiment of the system 2 of FIG. 1, including a semi-active approach to balancing noise 9 from a noise generating source 10. In this embodiment, the acoustic management system 6 obtains predetermined balance spectrum data 15 which indicates a weighted sound level necessary in order to balance the noise 9 emitted by the noise generating source 10. The predetermined balance spectrum data 15 can take into account the distance between the noise generating source 10 and the receptor 14, the level of the noise 9 emitted by the noise generating source 10, as well as the weighting (dBA, dBC) of that noise 9. In various embodiments, the predetermined balance spectrum data 15 can be entered by a user or a user-interfacing control system. In some cases, the predetermined balance spectrum data 15 can be obtained from an external system such as a data store, a control device linked with the noise generating source 10 or any other system. The predetermined balance spectrum data 15 can be updated according to any schedule, e.g., on a periodic (x times per minute, per hour, etc.), and in some cases, the predetermined balance spectrum data 15 is entered by a user and maintained until the user updates the predetermined balance spectrum data 15. In some embodiments, as in the embodiment described with reference to FIG. 1, the acoustic management system 6: a) obtains the predetermined balance spectrum data 15; b) determines an A-weighted sound decibel (dBA) level and a C-weighted sound decibel (dBC) level generated by a noise generating source 10; c) determines a difference between the dBA level and the dBC level (Δ dBC-dBA) from the noise generating source 10, and d) provides instructions to a sound generation system 16 to increase the dBA level of a balancing sound 18 proximate to the noise generating source 10 in response to determining the Δ dBC-dBA exceeds the predetermined threshold difference. In these embodiments, the predetermined balance spectrum data 15 replaces the sound data 12 of the embodiments of FIG. 1, thereby making this system "semi-active" when compared with the active system of FIG. 1.

Figure 3:
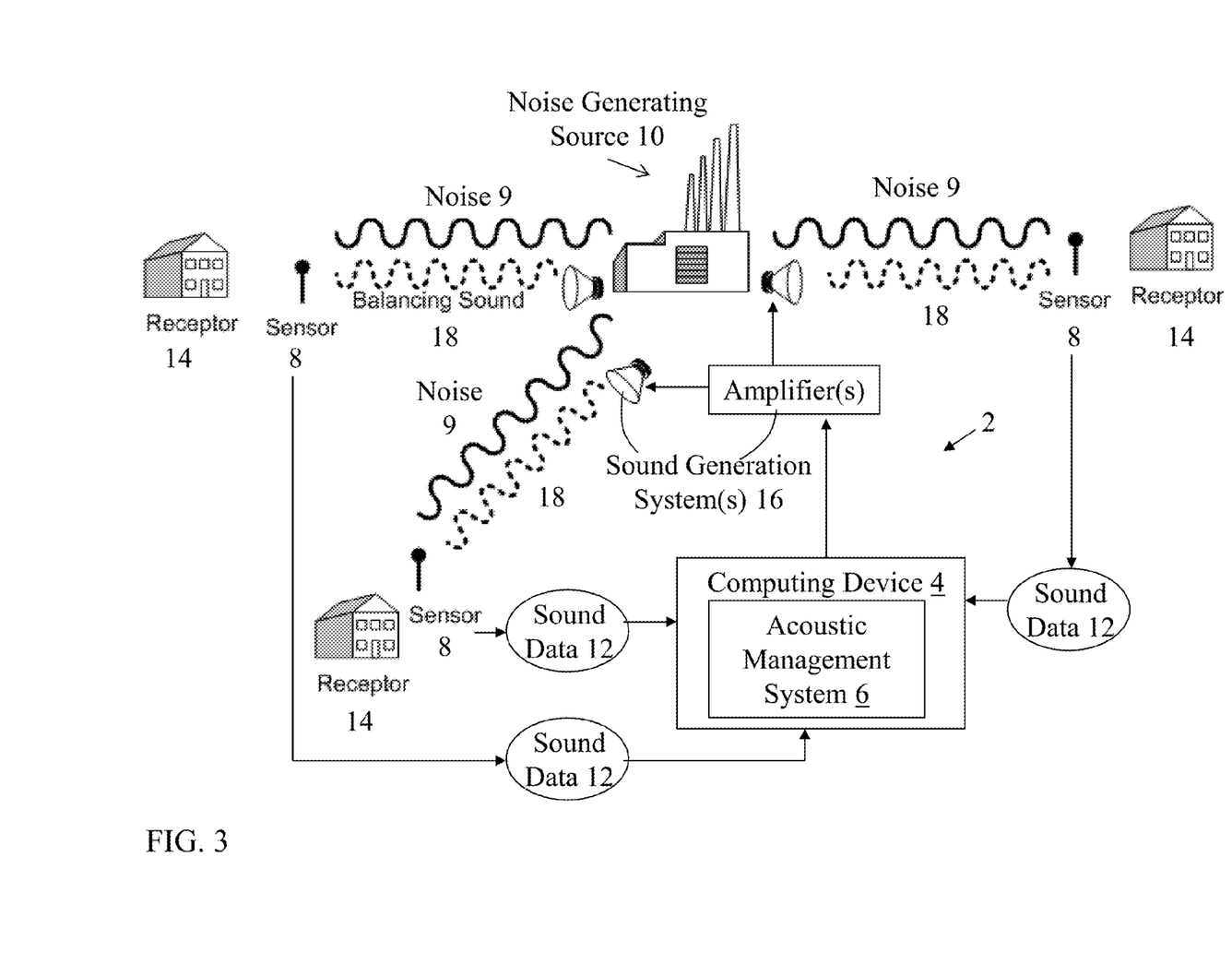
FIG. 3 shows a schematic depiction of a system within an environment according to various embodiments of the invention.

FIG. 3 shows an alternative embodiment where the system 2 is part of a multi-receptor configuration (e.g., multiple receptors 14). In this case, a plurality of sensors 8 can be employed to determine an amount of noise 9 reaching a commensurate number of receptors 14. In this case, the acoustic management system 6 can provide instructions to one or more sound generation system(s) 16 as described with reference to the embodiments of FIG. 1, however, in these embodiments, the acoustic management system 6 can manage a plurality of amplifiers and speakers to provide balancing sound(s) 18 to a plurality of receptors 14.

Figure 4:
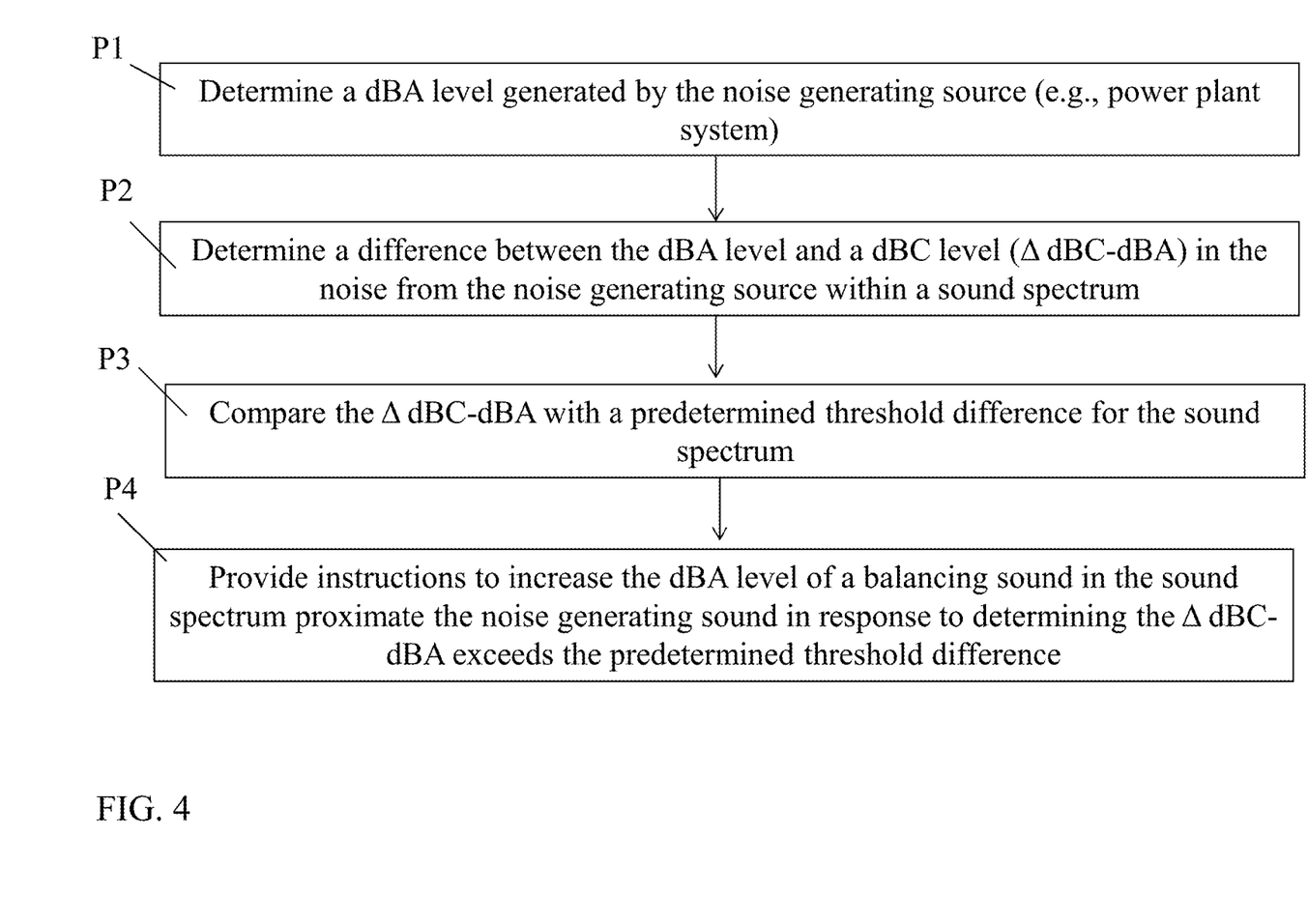
FIG. 4 shows a flow diagram illustrating processes according to various embodiments of the invention.

Turning to FIG. 4, with continuing reference to FIGS. 1-3, processes according to various embodiments can include:

Process P1: determining an A-weighted sound decibel (dBA) level generated by a noise generating source 10. This process can include obtaining sound data 12 (or predetermined balance spectrum data 15 in FIG. 2) about a noise emitted from a noise generating source 10. In various embodiments, the noise generating source 10 is a power plant system, e.g., a system for generating power which may include one or more turbines (gas or steam), electric generators, boilers, fluid tanks, etc. The sound data 12 can be obtained by a sensor 8, which can include a conventional microphone or other acoustic detection mechanism. The sensor 8 can be located proximate to the noise generating source 10, or remotely, depending upon the location of interest in determining the permitting parameters for the power plant.

Process P2 can include: determining a difference between the dBA level and a C-weighted sound decibel (dBC) level (Δ dBC-dBA) in the noise 9 from the noise generating source 10. This can include determining the dBC level of the noise 9 substantially simultaneously as the determining of the dBA level, or at a substantially distinct time. It is understood that process P2 and process P1 can be performed in any order, and as noted herein, can be performed substantially simultaneously in some embodiments.

Process P3 can include: comparing the Δ dBC-dBA with a predetermined threshold difference. As noted herein, the predetermined threshold difference can be dictated by a number of factors, some of which relate to a distance between the noise generating source 10 and one or more receptor(s) 14.

Process P4 can include: providing instructions to increase the dBA level of a balancing sound 18 proximate the noise generating source 10 in response to determining the Δ dBC-dBA exceeds the predetermined threshold difference. The acoustic management system 6, coupled with the sound generation system 16, can generate a balancing sound 18 having an increased dBA level to reduce the Δ dBC-dBA perceived at the receptor(s) 14. It is understood that the acoustic management system 6, in some embodiments, can increase the dBA level of the balancing sound 18 up to a maximum buffer amount, or delta, between the actual dBA level and the maximum dBA threshold. This buffer level functions as a limit on the amount that the dBA level can be increased before violating a dBA threshold.

Figure 5:
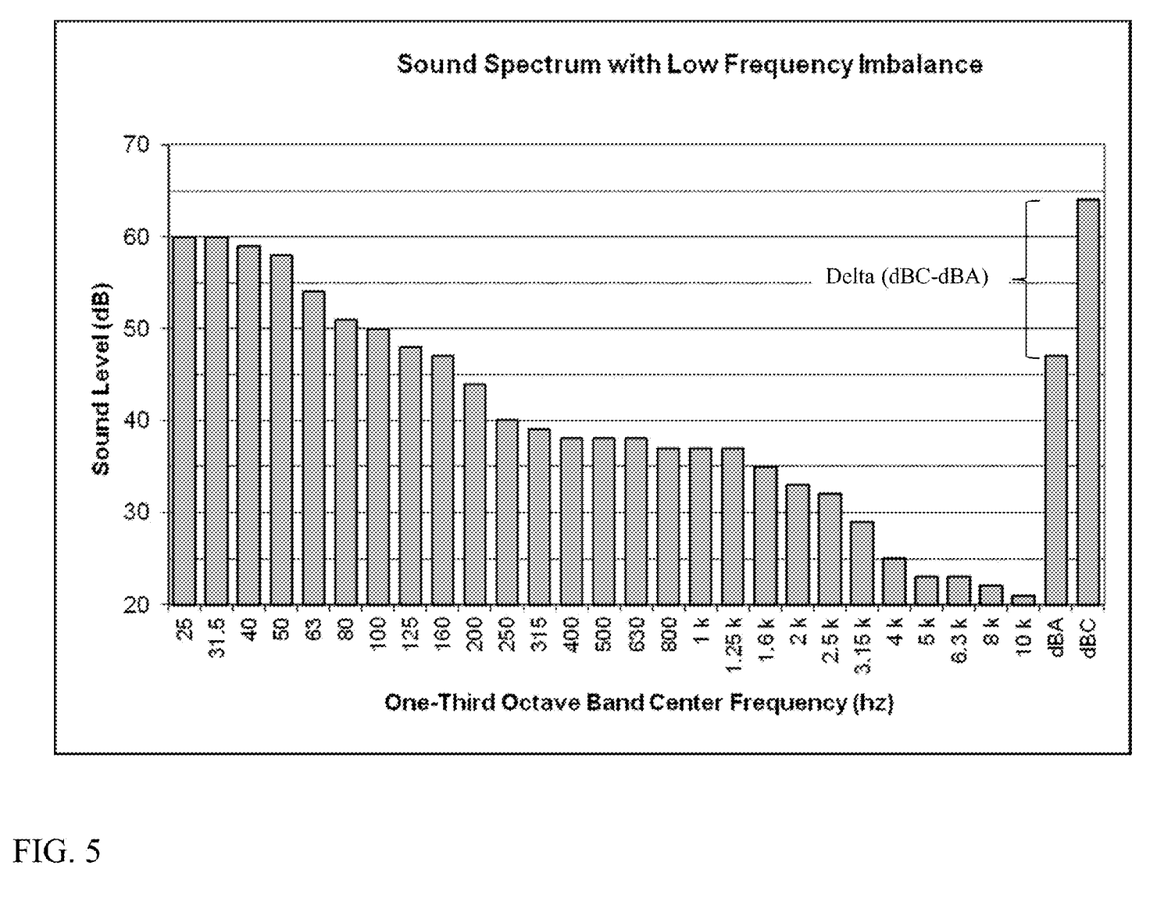
FIG. 5 shows an illustrative graphical depiction of the effects of managing acoustics according to the various embodiments of the invention.

FIG. 5 shows an illustrative graphical depiction of a sound spectrum, highlighting sound levels (in decibels) according to one-third octave bands (in Hertz). Each column in FIG. 5 represents a band of the frequency spectrum which includes a group of frequencies. As is known in the art, the numeral along the x-axis represents the center frequency of each respective band. The sound spectrum of FIG. 5 highlights a low frequency imbalance where the dBA level is significantly lower than the dBC level, with a difference (delta) of nearly 20 dB.

Figure 6:
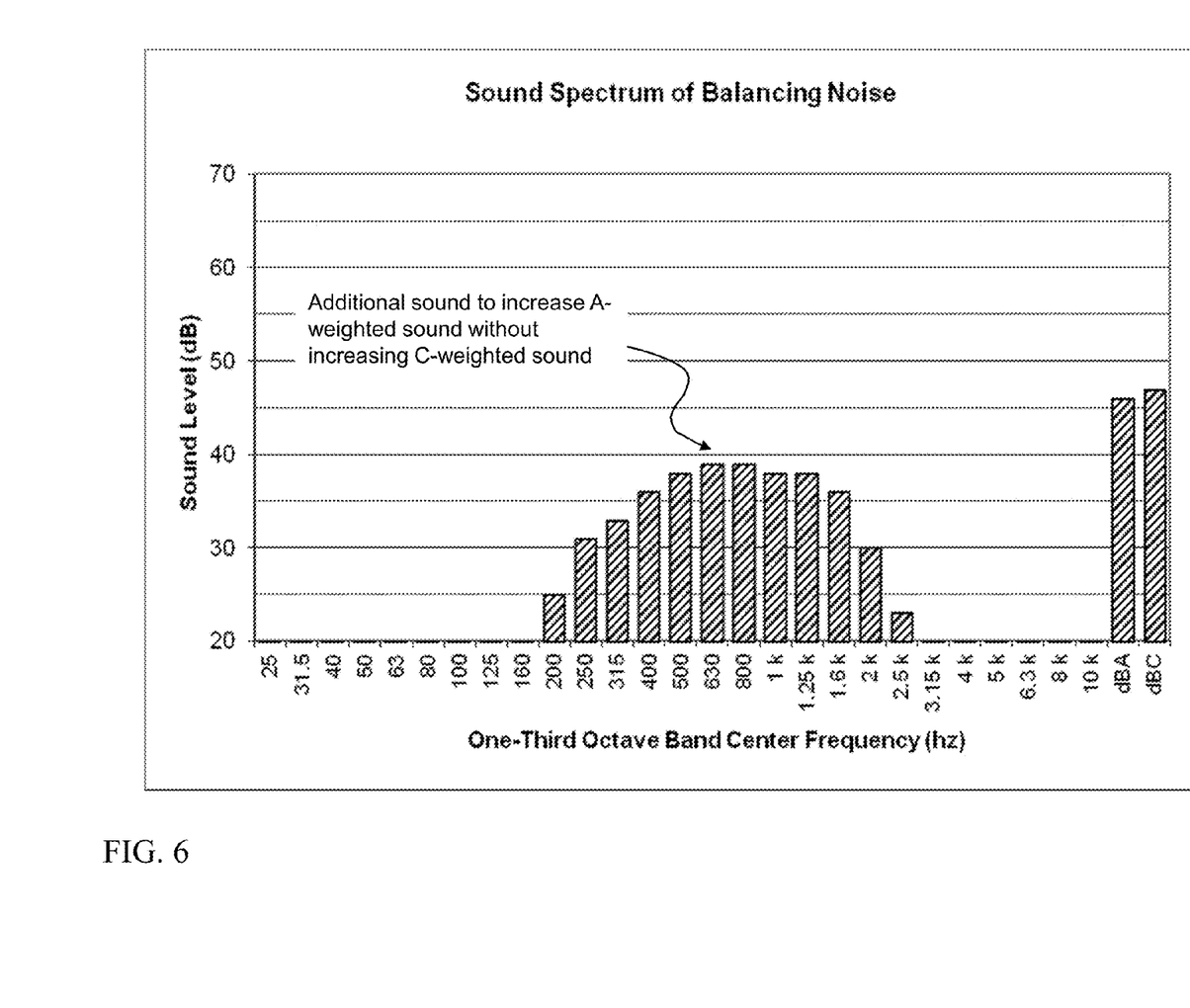
FIG. 6 shows an illustrative graphical depiction of the effects of managing acoustics according to the various embodiments of the invention.

FIG. 6 shows an illustrative graphical depiction of a balancing sound spectrum relative to the low frequency imbalance of FIG. 5, where the balancing sound spectrum is for increasing the A-weighted sound (dBA) without increasing the C-weighted sound (dBC), so as to reduce the Δ dBC-dBA level depicted in FIG. 5. In this case, the sound spectrum in FIG. 6 is introduced to reduce the Δ dBC-dBA level perceived at a receptor (e.g., receptor 14 in FIGS. 1-3).

Figure 7:
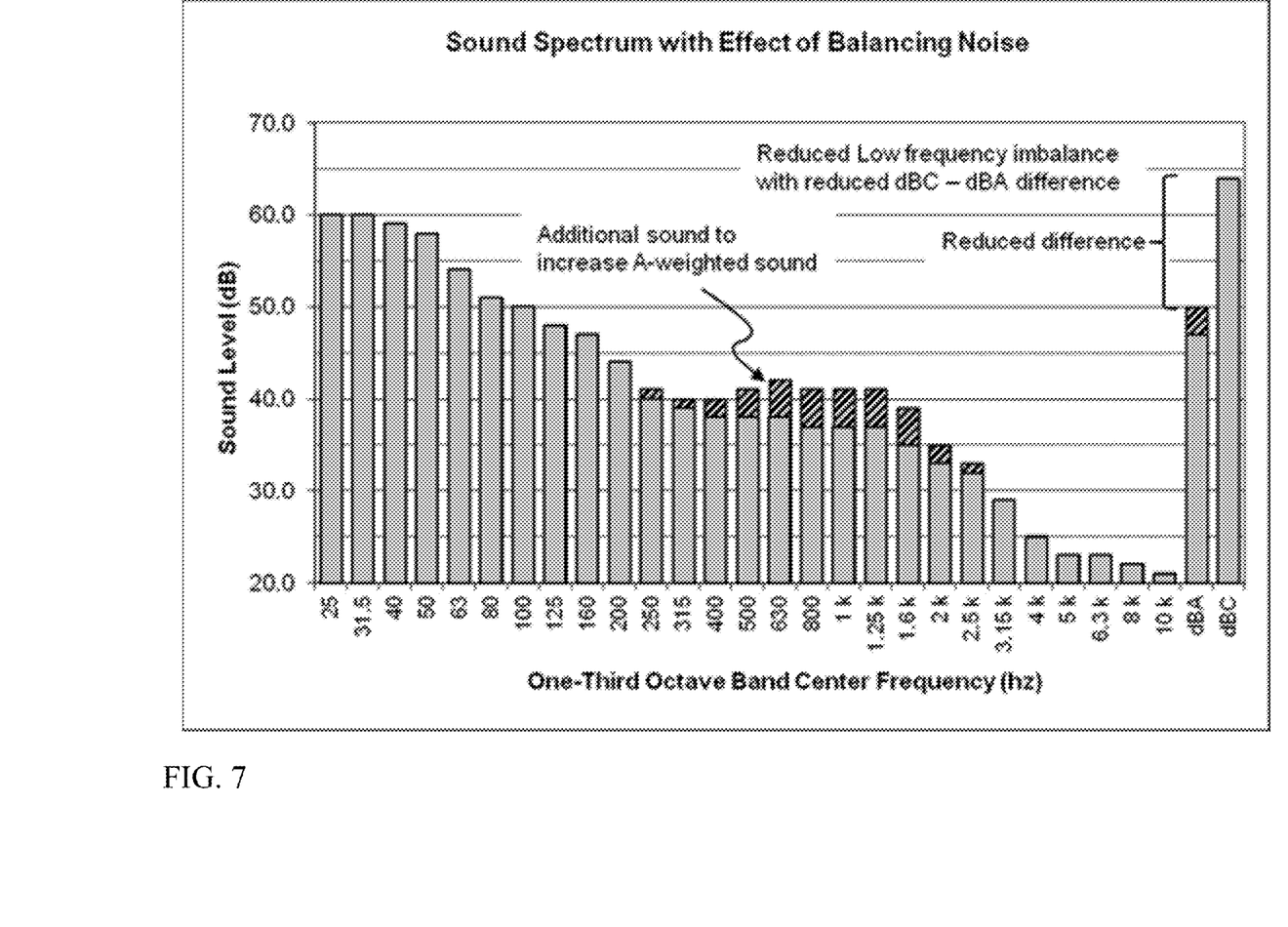
FIG. 7 shows an illustrative graphical depiction of the effects of managing acoustics according to the various embodiments of the invention.

FIG. 7 shows an illustrative graphical depiction of a sound spectrum adding the balancing spectrum of FIG. 6 on the spectrum of FIG. 5. As shown in this illustrative example, the sound level (dB) in one-third octave bands between 200 Hz-2.5 kHz are increased to reduce the Δ dBC-dBA level, as indicated at the far right-hand side of the graph. The "reduced difference" indicator shows how the increase in the dBA level in one-third octave bands 200 Hz-2.5 kHz reduces the Δ dBC-dBA sound level difference.

Figure 8:
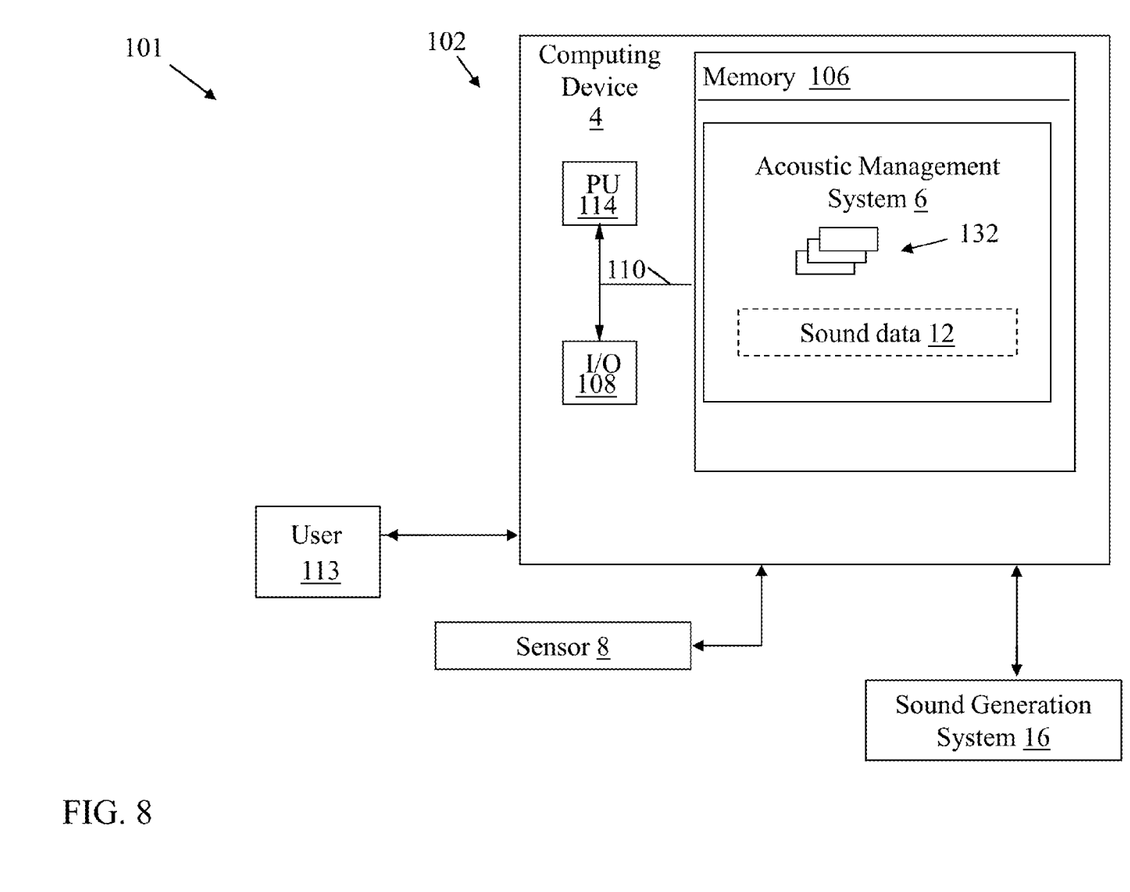
FIG. 8 shows an environment including systems according to various embodiments of the invention.

FIG. 8 depicts an illustrative environment 101 for performing the control system processes described herein with respect to various embodiments. To this extent, the environment 101 includes a computer system 102 that can perform one or more processes described herein in order to balance sound from a noise generating source 10 (FIGS. 1-3). In particular, the computer system 102 is shown as including an acoustic management system 6, which makes computer system 102 operable to control operation of a sound generation system 16 by performing any/all of the processes described herein and implementing any/all of the embodiments described herein.

The computer system 102 is shown including a computing device 4 (e.g., a processing component 114 having one or more processors), a storage component 106 (e.g., a storage hierarchy), an input/output (I/O) component 108 (e.g., one or more I/O interfaces and/or devices), and a communications pathway 110. In general, the processing component 114 executes program code, such as the acoustic management system 6, which is at least partially fixed in the storage component 106. While executing program code, the processing component 114 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 113 to interact with the computer system 102 and/or one or more communications devices to enable a system user 113 to communicate with the computer system 102 using any type of communications link. To this extent, the acoustic management system 6 can manage a set of interfaces (e.g., graphical user interface(s), application program interface, etc.) that enable human and/or system users 113 to interact with the acoustic management system 6. Further, the acoustic management system 6 can manage (e.g., store, retrieve, create, manipulate, organize, present, etc.) data, such as sound data 12 using any solution. The acoustic management system 6 can additionally communicate with the sensor 8 and/or sound generation system 16, e.g., via wireless and/or hardwired means.

In any event, the computer system 102 can comprise one or more general purpose computing articles of manufacture (e.g., computing devices) capable of executing program code, such as the acoustic management system 6, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the acoustic management system 6 can be embodied as any combination of system software and/or application software.

Further, the acoustic management system 6 can be implemented using a set of modules 132. In this case, a module 132 can enable the computer system 102 to perform a set of tasks used by the acoustic management system 6, and can be separately developed and/or implemented apart from other portions of the acoustic management system 6. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 114, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of acoustic management system 6 fixed thereon (e.g., one or more modules 132). However, it is understood that the computer system 102 and acoustic management system 6 are only representative of various possible equivalent computer systems that may perform a process described herein. To this extent, in other embodiments, the functionality provided by the computer system 102 and acoustic management system 6 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as sound data 12 using any solution. The computer system 102 can generate sound data 12, from one or more data stores, receive sound data 12, from another system such as the sensor 8, send historical sound data 12 to another system, etc.

While shown and described herein as a method and system for controlling a sound generation system 16, e.g., in response to determining that the Δ dBC-dBA exceeds a threshold, it is understood that aspects of the invention further provide various alternative embodiments. For example, in one embodiment, the invention provides a computer program fixed in at least one computer-readable medium, which when executed, enables a computer system to control a sound generation system 16. To this extent, the computer-readable medium includes program code, such as the acoustic management system 6 (FIGS. 1-3 and 8), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the acoustic management system 6 (FIGS. 1 and 4), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for controlling a sound generation system 16 (e.g., in response to determining a delta between the dBC and dBA exceeds a predetermined threshold). In this case, a computer system, such as the computer system 102 (FIG. 4), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

In any case, the acoustic management system 6 has the technical effect of managing sound generation (e.g., at sound generation system 16) in an environment proximate a noise generating source. That is, the acoustic management system 6 has the technical effect of balancing sound in an environment.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

I claim:

1. A system comprising:
    at least one computing device having a memory and a processor, the at least one computing device configured to perform the following:
        determine a difference between an A-weighted sound decibel (dBA) level and a C-weighted sound decibel (dBC) level ($\Delta$ dBC-dBA) from a power plant system within a sound spectrum;
        compare the $\Delta$ dBC-dBA with a predetermined threshold difference for the sound spectrum; and
        provide instructions to increase the dBA level of a balancing sound in the sound spectrum proximate the power plant system in response to determining the $\Delta$ dBC-dBA exceeds the predetermined threshold difference.

2. The system of claim 1, wherein the at least one computing device is further configured to compare the dBA level to a predetermined dBA threshold level to determine a dBA buffer amount.

3. The system of claim 2, wherein the at least one computing device is further configured to provide instructions to increase the dBA level of the balancing sound by no more than the dBA buffer amount.

4. The system of claim 1, wherein the dBA level corresponds with a higher frequency noise than the dBC level.

5. The system of claim 1, wherein the instructions are provided to a sound generation system for generating the balancing sound proximate the power plant system.

6. The system of claim 1, wherein the determining of the $\Delta$ dBC-dBA from the power plant system within the sound spectrum includes:
    determining the dBA level generated by the power plant system within the sound spectrum;
    determining the dBC level generated by the power plant system within the sound spectrum; and
    comparing the dBA level with the dBC level to determine the $\Delta$ dBC-dBA.

7. The system of claim 6, wherein the determining of the dBA level, the dBC level and the $\Delta$ dBC-dBA are performed by continuously measuring sound from the power plant system.

8. The system of claim 1, further comprising a sound generation system operably connected with the at least one computing device, the sound generation system configured to receive the instructions from the at least one computing device and emit the balancing sound to increase the dBA level.

9. A computer-implemented method comprising:
    determining a difference between an A-weighted sound decibel (dBA) level and a C-weighted sound decibel (dBC) level ($\Delta$ dBC-dBA) from a noise generating source within a sound spectrum;
    comparing the $\Delta$ dBC-dBA with a predetermined threshold difference for the sound spectrum; and
    providing instructions to increase the dBA level of a balancing sound in the sound spectrum proximate the noise generating source in response to determining the $\Delta$ dBC-dBA exceeds the predetermined threshold difference.

10. The method of claim 9, further comprising comparing the dBA level to a predetermined dBA threshold level to determine a dBA buffer amount.

11. The method of claim 10, further comprising increasing the dBA level of the balancing sound by no more than the dBA buffer amount.

12. The method of claim 9, wherein the dBA level corresponds with a higher frequency noise than the dBC level.

13. The method of claim 9, wherein the providing of the instructions includes providing the instructions to a sound generation system for generating the balancing sound proximate the noise generating source.

14. The method of claim 9, wherein the determining of the $\Delta$ dBC-dBA level is performed by continuously measuring sound generated by the sound generating source.

15. A computer program product stored on a non-transitory computer readable medium, which when executed by at least one computing device, causes the at least one computing device to:
    determine a difference between an A-weighted sound decibel (dBA) level and a C-weighted sound decibel (dBC) level ($\Delta$ dBC-dBA) from a noise generating source within the sound spectrum;
    compare the $\Delta$ dBC-dBA with a predetermined threshold difference for the sound spectrum; and
    provide instructions to increase the dBA level of a balancing sound in the sound spectrum proximate the noise generating source in response to determining the $\Delta$ dBC-dBA exceeds the predetermined threshold difference.

16. The computer program product of claim 15, wherein the at least one computing device is further configured to compare the dBA level to a predetermined dBA threshold level to determine a dBA buffer amount.

17. The computer program product of claim 16, wherein the at least one computing device is further configured to increase the dBA level of the balancing sound by no more than the dBA buffer amount.

18. The computer program product of claim 15, wherein the dBA level corresponds with a higher frequency noise than the dBC level.

19. The computer program product of claim 15, wherein the providing of the instructions includes providing the instructions to a sound generation system for generating the balancing sound proximate the noise generating source.

20. The computer program product of claim 15, wherein the determining of the $\Delta$ dBC-dBA level is performed by continuously measuring sound generated by the sound generating source.

\* \* \* \* \*